United States Patent
Thai et al.

(10) Patent No.: US 7,524,381 B2
(45) Date of Patent: Apr. 28, 2009

(54) METHOD FOR CONTROLLING MAGNETOSTRICTION IN A FREE LAYER OF A MAGNETORESISTIVE SENSOR

(75) Inventors: Ben Long Thai, San Ramon, CA (US); Dulip Ajantha Welipitiya, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 396 days.

(21) Appl. No.: 11/318,274

(22) Filed: Dec. 22, 2005

(65) Prior Publication Data

US 2007/0144616 A1   Jun. 28, 2007

(51) Int. Cl.
*H01F 1/12* (2006.01)
*G11B 5/127* (2006.01)
*H04R 31/00* (2006.01)

(52) U.S. Cl. ............... 148/121; 29/603.07; 360/324.11; 360/324.12

(58) Field of Classification Search ............ None
See application file for complete search history.

(56) References Cited

U.S. PATENT DOCUMENTS

| | | | |
|---|---|---|---|
| 2002/0101689 A1 | 8/2002 | Tang et al. | 360/314 |
| 2003/0123201 A1* | 7/2003 | Choe | 360/324.12 |
| 2004/0090717 A1 | 5/2004 | Lee et al. | 360/324.11 |
| 2004/0179311 A1 | 9/2004 | Li et al. | 360/324.12 |
| 2004/0206619 A1 | 10/2004 | Pinarbasi | 204/192.2 |
| 2005/0201022 A1 | 9/2005 | Horng et al. | 360/324.11 |
| 2007/0223151 A1* | 9/2007 | Horng et al. | 360/324.11 |

* cited by examiner

*Primary Examiner*—John P. Sheehan
(74) *Attorney, Agent, or Firm*—Zilka-Kotab, PC

(57) ABSTRACT

A method for controlling magnetostriction in a free layer of a magnetoresistive sensor. A pinned layer structure is deposited and then a spacer layer, preferably Cu is deposited. Oxygen is introduced into the spacer layer. The oxygen can be introduced either during the deposition of the spacer layer or after the spacer layer has been deposited. A free layer structure is then deposited over the spacer layer. A capping layer such as Ta can be deposited over the free layer structure. The sensor is annealed to set the magnetization of the pinned layer. In the process of annealing the sensor the oxygen migrates out of the spacer. After annealing, no significant amount of oxygen is present in either the spacer layer or the free layer structure, and only trace amounts of oxygen are present in the Ta capping layer. Although no Oxygen remains in either the spacer layer or the free layer, the introduction of oxygen during manufacture causes the finished free layer to have a lower magnetostriction (ie greater negative magnetostriction).

29 Claims, 12 Drawing Sheets

METHOD FOR CONTROLLING MAGNETOSTRICTION IN A FREE LAYER OF A MAGNETORESISTIVE SENSOR

FIELD OF THE INVENTION

The present invention relates to magnetoresistive sensors and more particularly to a method for controlling the magnetostriction of a free layer in a magnetoresistive sensor.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos\Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

The ever increasing demand for increased data rate and data capacity has lead a relentless push to develop magnetoresistive sensors having improved signal amplitude and reduced track width. However, as sensors become smaller the free layers in such sensors become less stable. Free layer stability refers to the ability of the magnetization of the free layer to remain biased in a desired direction parallel with the ABS. This instability in very small sensors is due to several factors, including the reduced area on which a biasing layer can act magnetostatically to provide a bias field. Another factor affecting the stability is the small size of the free layer itself, which makes the free layer inherently magnetically unstable.

A critical parameter for controlling free layer stability is the magnetostriction of the free layer. Magnetoresistive sensors have an inherent compressive stress acting in a direction parallel with ABS. This compressive stress is due, among other things, to stresses generated by lapping when defining the air bearing surface (ABS). A positive magnetostriction in a free layer will induce a magnetic anisotropy in a direction that is perpendicular to the ABS and perpendicular to the desired biasing direction. This of course hinders free layer stability, making proper biasing of the free layer magnetization very difficult.

Free layers are generally constructed as a combination of a layer of CoFe and a layer of NiFe with the CoFe layer being located closest to the spacer layer (or barrier in the case of a tunnel valve). CoFe is known to have a positive magnetostriction, but is needed close to the spacer/barrier layer in order for the sensor to operate optimally. The NiFe layer has a negative magnetostriction which can be used to offset the positive magnetostriction of the CoFe layer somewhat. However, the overall thickness of the free layer is limited, because as the free layer becomes thicker its coercivity increases, thereby decreasing sensor performance. On the other hand, a certain minimum thickness of the CoFe layer must be maintained in order for the sensor to function properly. Therefore, it can be seen, that one can not simply increase the thickness of the NiFe layer of the free layer to create a desired negative or neutral magnetostriction.

Therefore, there is a need for a method for controlling the magnetostriction of a free layer without the need to increase thickness of the NiFe layer of the free layer. Such a method must not interfere with other magnetic properties of the free layer such that sensor performance would suffer. For example, such a method for adjusting magnetostriction should not result in an increased coercivity of the free layer, as such increased coercivity would decrease the sensitivity of the sensor.

SUMMARY OF THE INVENTION

The present invention provides a method for manufacturing a magnetoresistive sensor, that allows for control of magnetostriction of the free layer. The method includes depositing a spacer layer and introducing oxygen into the spacer layer. The free layer is then deposited over the spacer layer. Annealing the sensor to set the magnetization of the pinned layer causes the oxygen in the spacer layer to migrate out of the spacer layer and also out of the free layer.

The spacer layer may be Cu and can be deposited on a pinned layer structure that can be an AP pinned structure that is exchange coupled to an AFM layer. The free layer can include a layer of CoFe and a layer of NiFe formed there over. A Ta capping layer can be formed over the free layer.

It has been found that after anneal, virtually no oxygen remains in the spacer layer or the free layer, and only trace amounts of oxygen remain in the Ta capping layer. However, the introduction of oxygen into the spacer layer during manufacture causes the free layer to have a lower (greater negative) magnetostriction.

Advantageously this reduced magnetostriction is achieved without affecting other critical magnetic properties of the sensor. This reduced magnetostriction is also achieved without the need to adjust the relative thicknesses of the CoFe and NiFe layers of the free layer.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
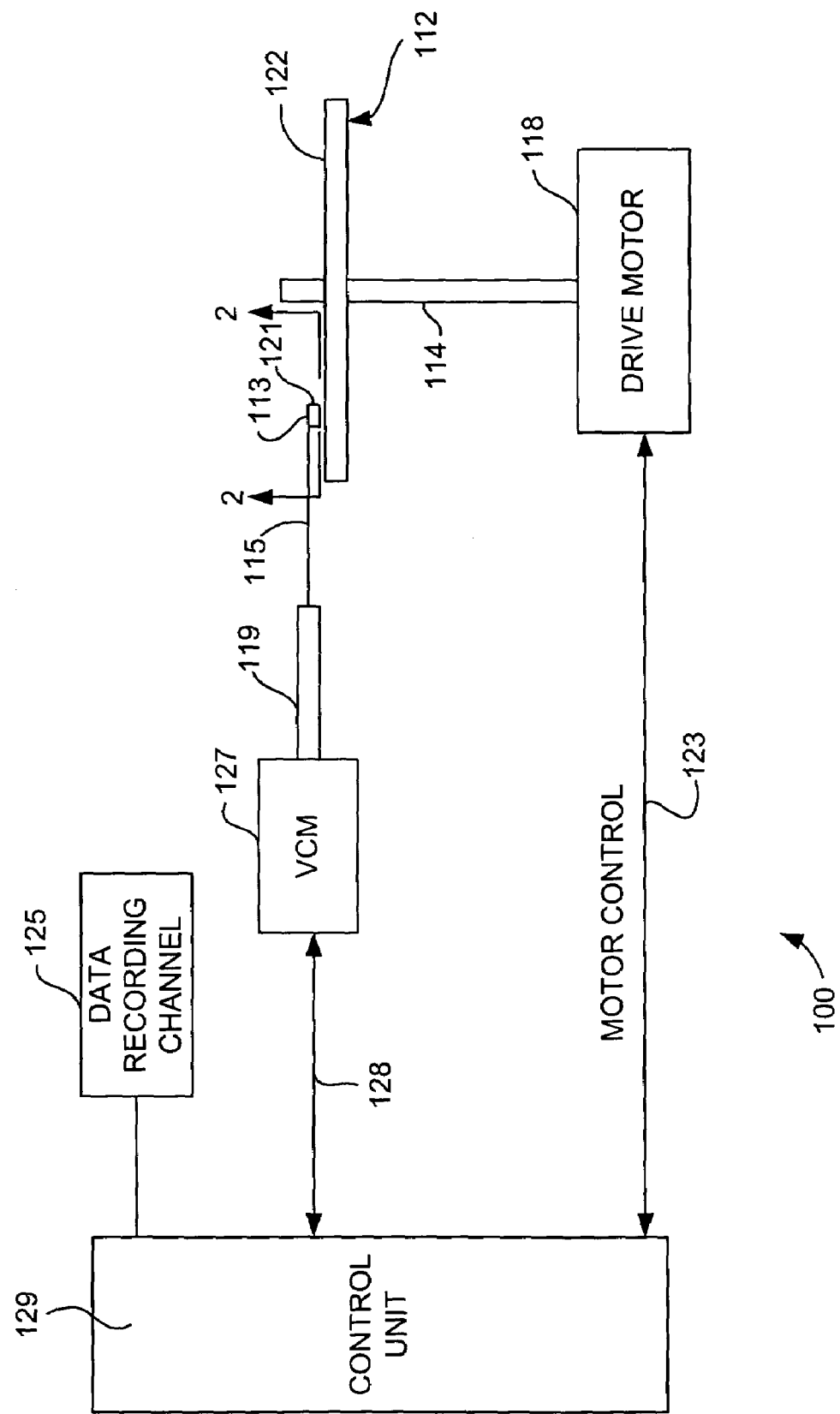
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
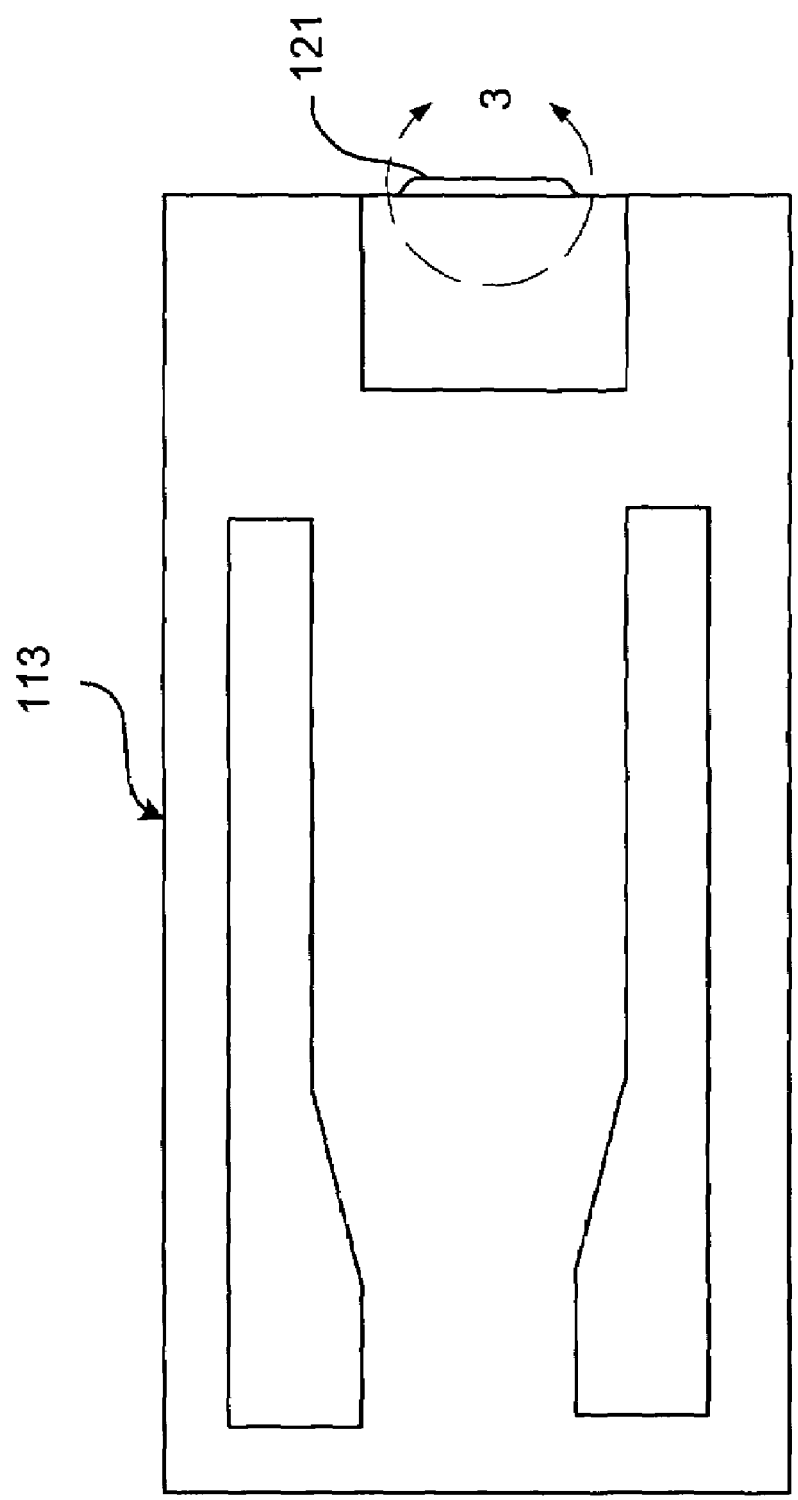
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
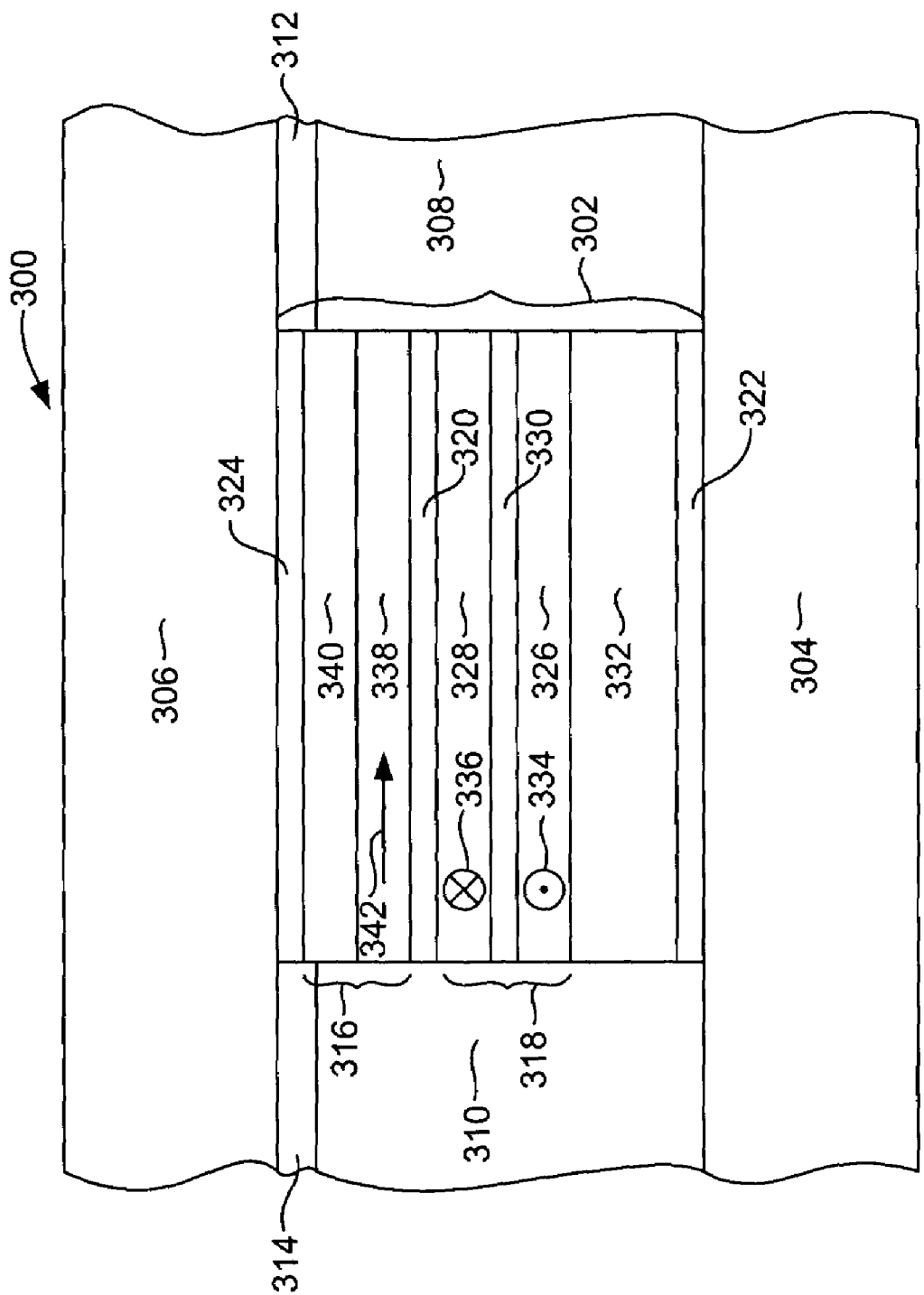
FIG. 3 is an enlarged ABS view taken from circle 3 of FIG. 2 rotated 90 degrees counterclockwise.

With reference now to FIG. 3, a magnetoresistive sensor 300 according to an embodiment of the invention includes a sensor stack 302 that is sandwiched between first and second non-magnetic, electrically insulating gap layers 304, 306. The gap layers 304, 306 can be constructed of, for example, alumina. First and second hard bias layers 308, 310 may be provided at either side of the sensor stack 302, and may be constructed of, for example CoPtCr, or some other hard magnetic material. First and second lead layers 312, 314, constructed, of, for example Au, Cu, Rh, etc. may be provided above the hard bias layers 308, 310 to facilitate the delivery of a sense current to the sensor.

With continued reference to FIG. 3, the sensor stack 302 includes a free layer structure 316, a pinned layer structure 318 and a non-magnetic, electrically conductive spacer layer 320 sandwiched between the free layer and the pinned layer structure. The spacer layer can be constructed of Cu. A seed layer 322 may be provided at the bottom of the sensor stack 302 to promote a desired crystalline growth in the sensor layers, and a capping layer 324 constructed of, for example Ta can be provided at the top of the sensor stack 302 to protect the sensor layers from damage during manufacture.

The pinned layer structure may be of various types such as self pinned, simple pinned, but is preferably an AFM pinned, AP pinned structure including first and second ferromagnetic layers AP1, 326, and AP2 328 which are antiparallel coupled across a non-magnetic AP coupling layer 330 such as Ru. The AP1 and AP2 layers 326, 328 may be constructed of, for example CoFe. A layer of anitferromagnetic material 332 such as PtMn or IrMn is exchange coupled with the AP1 layer 326, which strongly pins the magnetization 334 of the AP1 layer 326 in a desired direction perpendicular to the ABS. Antiparallel coupling between the AP1 layer 326 and the AP2 layer 328 pins the magnetization 336 of the AP2 layer.

With continued reference to FIG. 3, the free layer may be constructed as a layer of CoFe 338 and a layer of NiFe 340, with the CoFe layer 338 being disposed closest to the spacer layer 320. The free layer has a magnetization 342 that is biased in a desired direction parallel with the ABS, but which is free to rotate in response to a magnetic field. The magnetization 342 of the free layer 316 is biased by a bias field from each of the hard bias layers 308, 310. Alternatively, biasing may be achieved by an in stack bias structure (not shown).

The free layer has a net magnetostriction that is neutral or negative as desired depending on design requirements. As discussed above, a negative magnetostriction when combined with compressive stresses that are inherently present in the senor stack 302 result in a magnetic anisotropy that is oriented parallel with the ABS and parallel with the biased magnetization 342 of the free layer 316. Such a negative magnetostriction is desirable, because it assists the biasing of the free layer 316 and promotes free layer stability. However, too much of a negative magnetostriction would hinder free layer sensitivity, making the free layer too stiff (ie. the magnetization 342 could become insensitive to signal fields). Therefore, according to the present invention, the free layer 316 has a desired amount of magnetostriction.

The magnetostriction of the free layer 316 is controlled by a novel manufacturing process that will be described below. Using this novel manufacturing process, the magnetostriction of the free layer 316 can be controlled without having to adjust the thicknesses of the layers 338, 340 of the free layer 316. This advantageously allows the layers 338, 340 to be formed to thicknesses that provide optimal magnetic performance for the sensor 300.

With reference now to FIGS. 4-12 a process for constructing a magnetoresistive sensor according to an embodiment of the invention is described. With particular referenced to FIG. 4, a series of sensor layers are deposited onto a substrate 402 which can be a non-magnetic electrically insulating gap layer such as the gap 304 described in FIG. 3. The sensor layers deposited over the substrate may include a seed layer 404 such as NiFeCr or NiFeCr and NiFe. An AFM layer 406 such as PtMn or IrMn is deposited over the seed layer, followed by an AP1 layer 408, Ru spacer layer 410 and AP2 layer 412. The AP1 and AP2 layers 408, 412 can be, for example CoFe, but could be some other material. Then, a non-magnetic, electrically conductive spacer layer 414, preferably Cu, is deposited over the AP2 layer 412.

Figure 5:
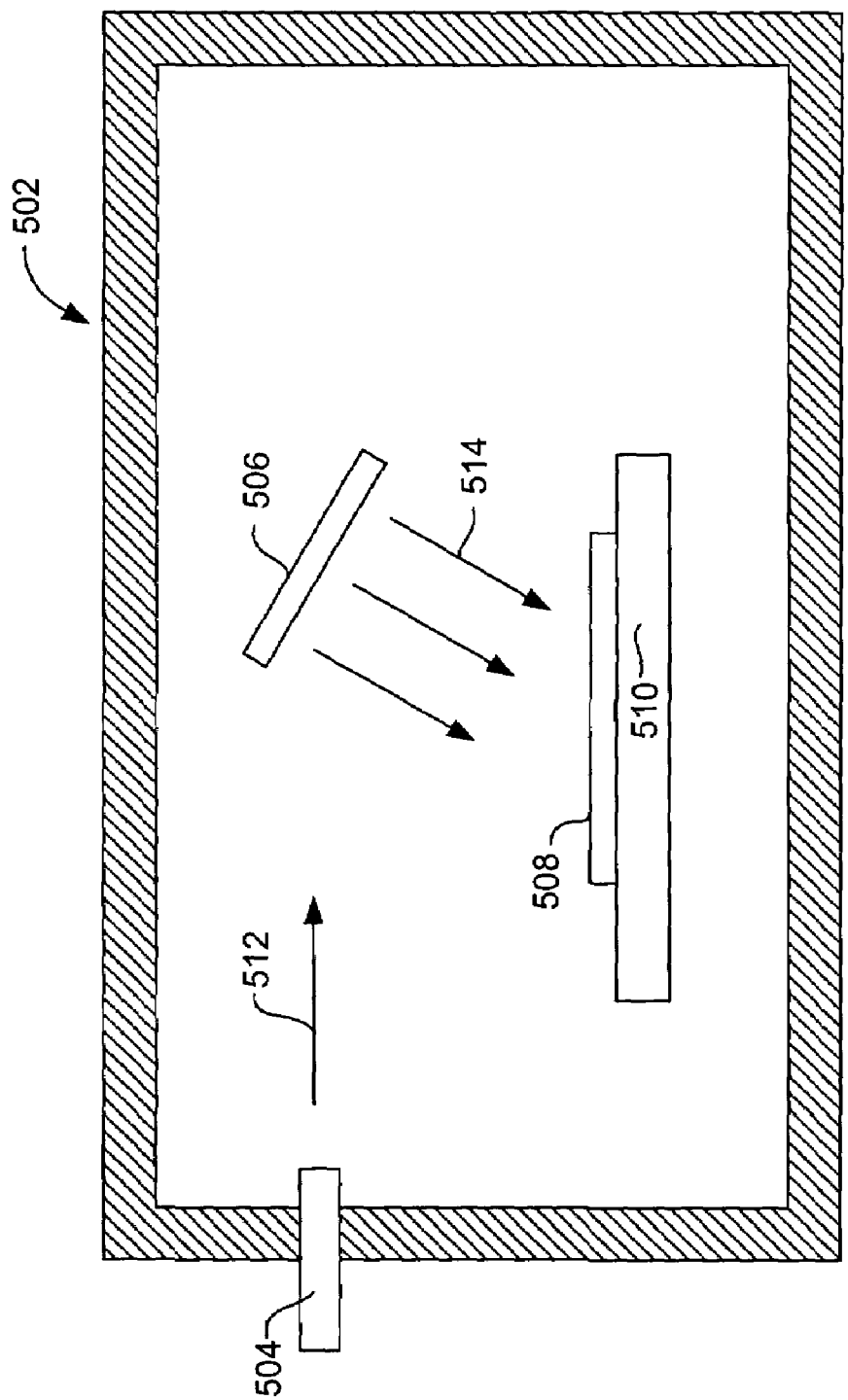
FIG. 5 is a schematic illustration of a deposition chamber in which sensor layers can be deposited.

The above described layers 402-414 can be deposited in a sputter deposition chamber 502 as illustrated in FIG. 5. The sputter deposition chamber 502 includes an ion beam gun 504 and a target 506. A wafer 508 is held within the chamber 502 on a chuck 510. An ion beam 512 from the ion beam gun causes ions and/or atoms 514 to be dislodged from the target and deposited onto the wafer 508.

With reference again to FIG. 4, a desired amount of oxygen ($O_2$) is introduced into the spacer layer 414 (corresponding to the spacer layer 320 described in FIG. 3). There are at least two methods for introducing oxygen into the spacer layer 414. One method is by adsorption of several mono-layers of oxygen on the surface of the spacer layer 414. This can be performed by first depositing the spacer layer 414 and then exposing the spacer layer 414 to an atmosphere that contains oxygen.

Another method for introducing oxygen into the spacer layer 414 is by introducing oxygen during the sputter deposition of the spacer layer 414. This can be accomplished either by introducing a desired amount of oxygen into the atmosphere of the sputter deposition chamber 502 (FIG. 5) or by including a desired amount of oxygen in the target 506 within the deposition chamber 502. For example, the target 506 could be constructed of an copper oxide.

Figure 6:
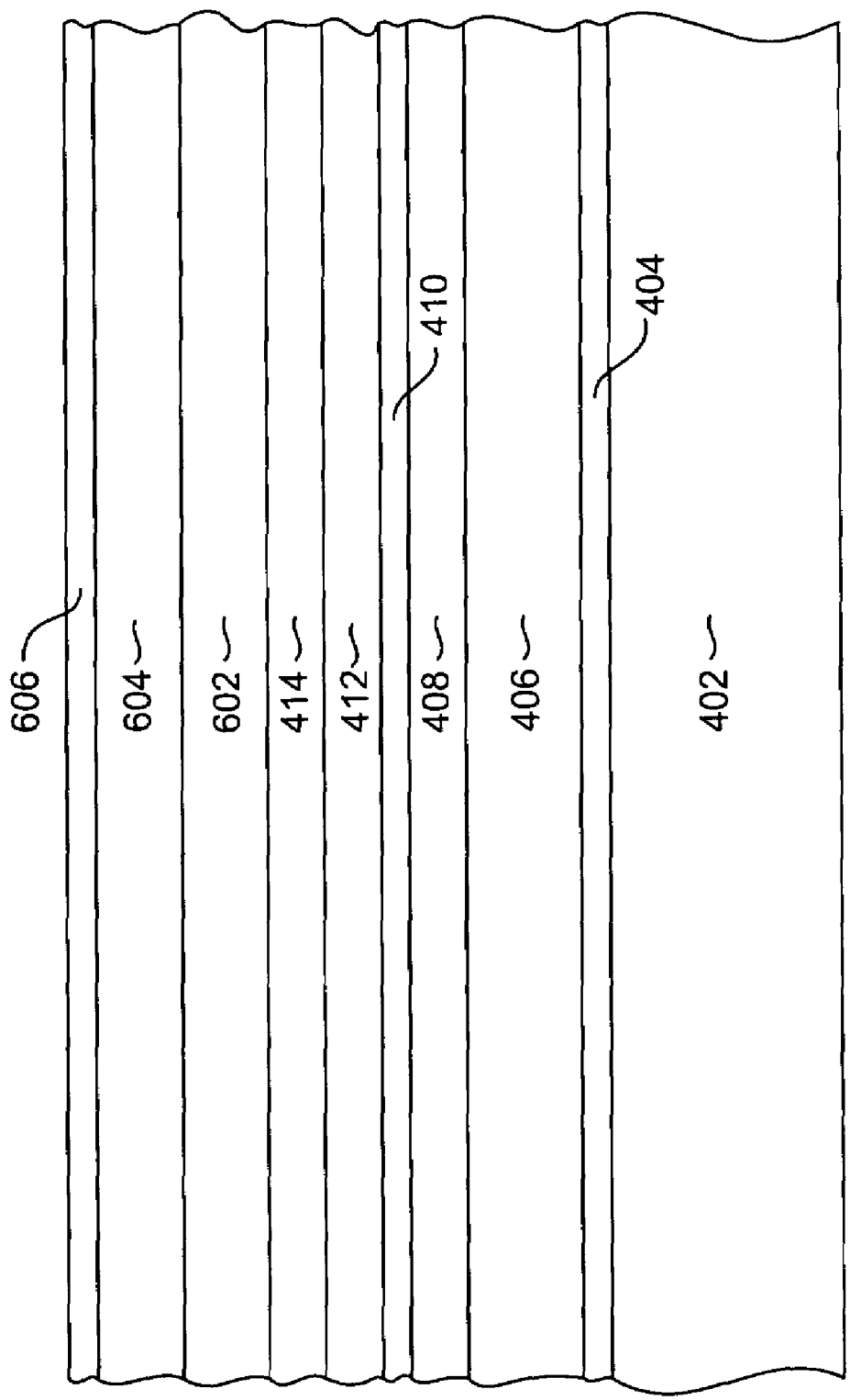
FIGS. 6-11 are views of a sensor in various intermediate stages of manufacture illustrating a method of manufacturing a sensor according to an embodiment of the invention.

With reference now to FIG. 6, the rest of the sensor layers can be deposited. A first layer 602 of the free layer is deposited over the spacer layer 414, this first layer preferably containing CoFe. A second layer 604 of the free layer is then deposited, preferably containing NiFe. Thereafter, a capping layer 606 such as Ta may be deposited.

Figure 7:
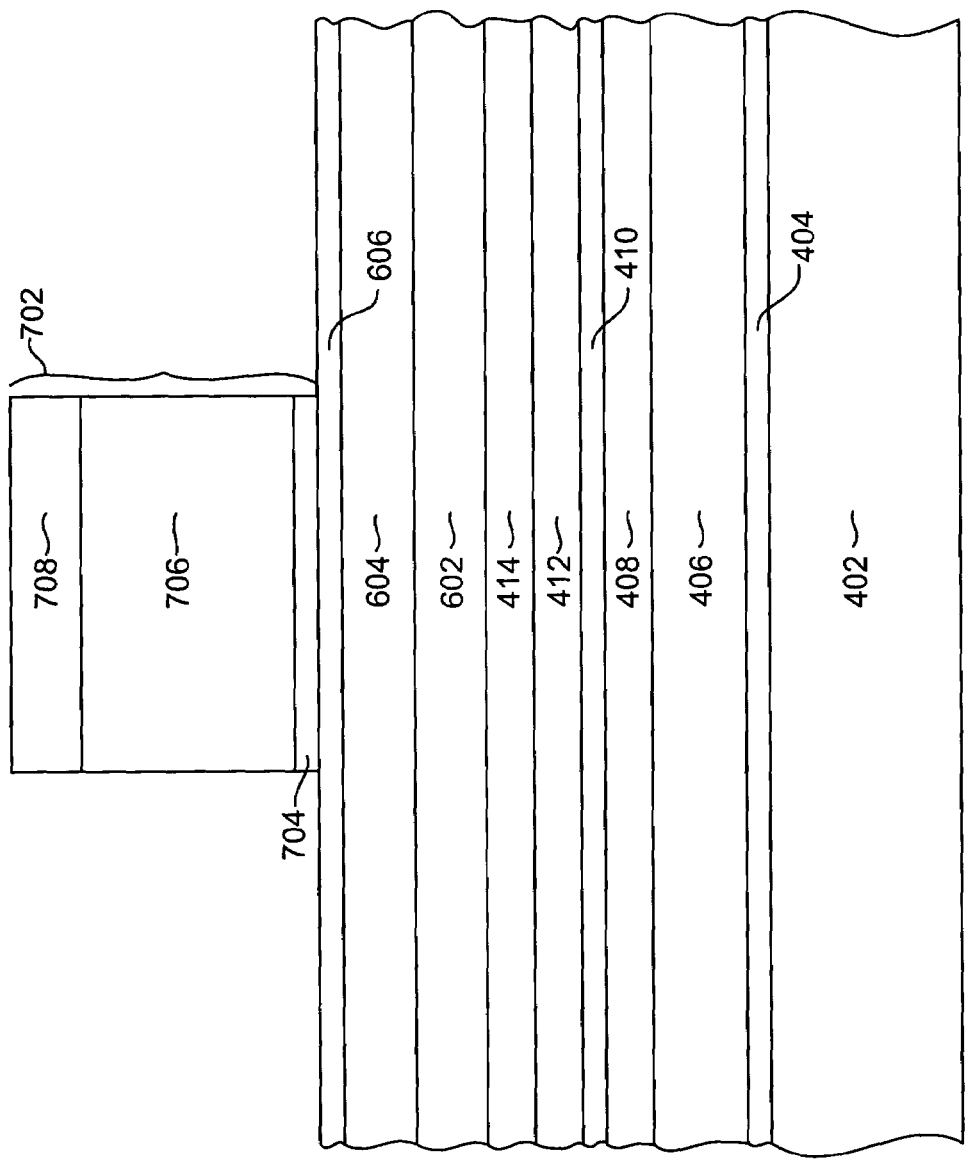
Figure 8:
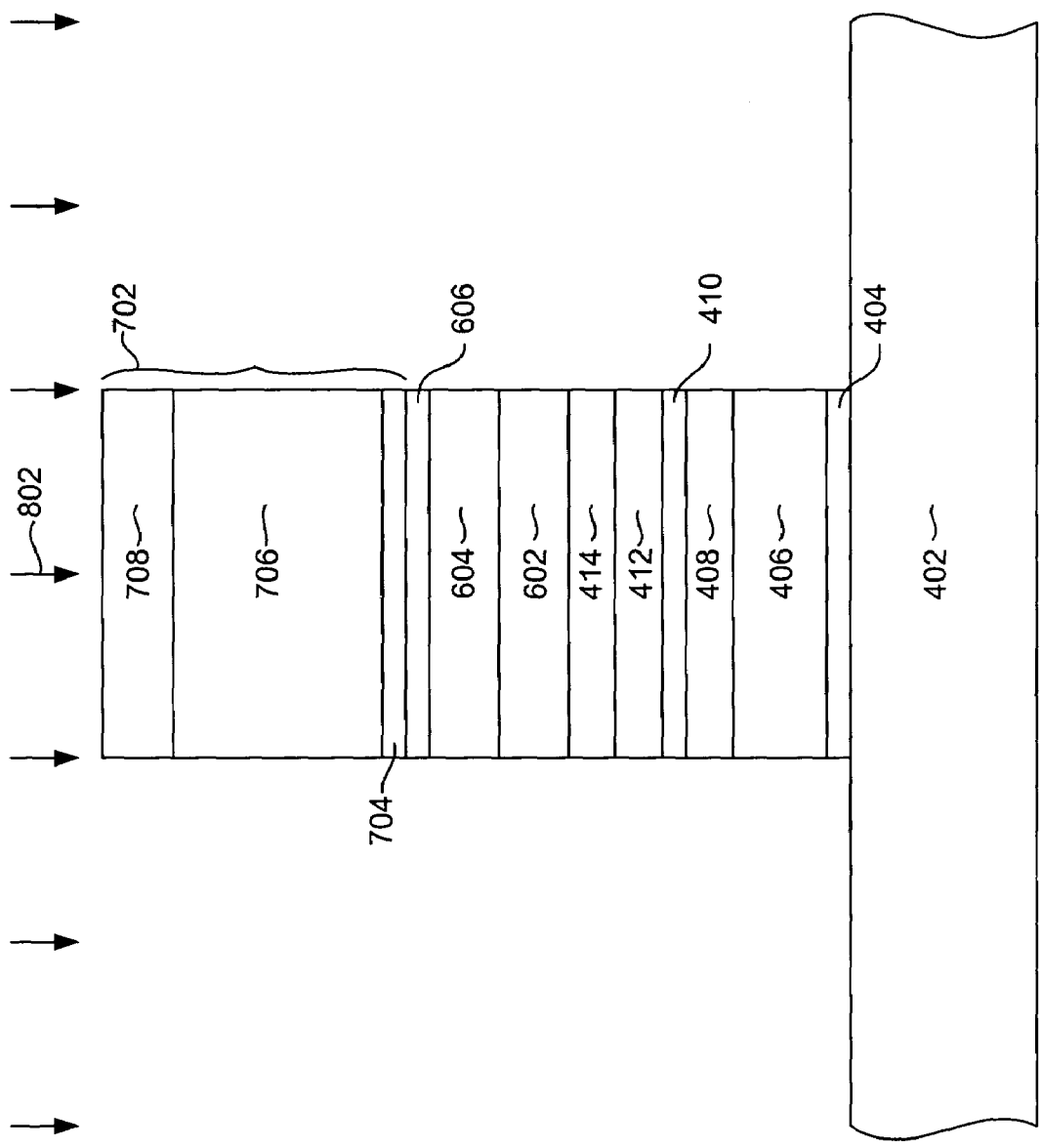

With reference now to FIG. 7 a mask structure 702 is formed over the sensor layers 402-414 and 602-606. The mask 702 may include a hard mask layer 704 such as alumina, DLC, etc. an image transfer layer 706 such as DURIMIDE® or some similar material and a photoresist mask 708. The mask structure 702 can be formed by depositing the layers 704-708 full film and then photolithographically patterning the photoresist layer 708. A material removal process such as RIE can then be performed to transfer the image of the photoresist mask 708 onto the underlying layers 704, 706. With reference to FIG. 8 an ion mill 802 can be performed to define the sensor. It should be pointed out that one masking and milling operation can be performed to define the track width of the sensor, while another similar masking and milling operation can be performed to define the stripe height of the sensor (dimension from the ABS).

Figure 9:
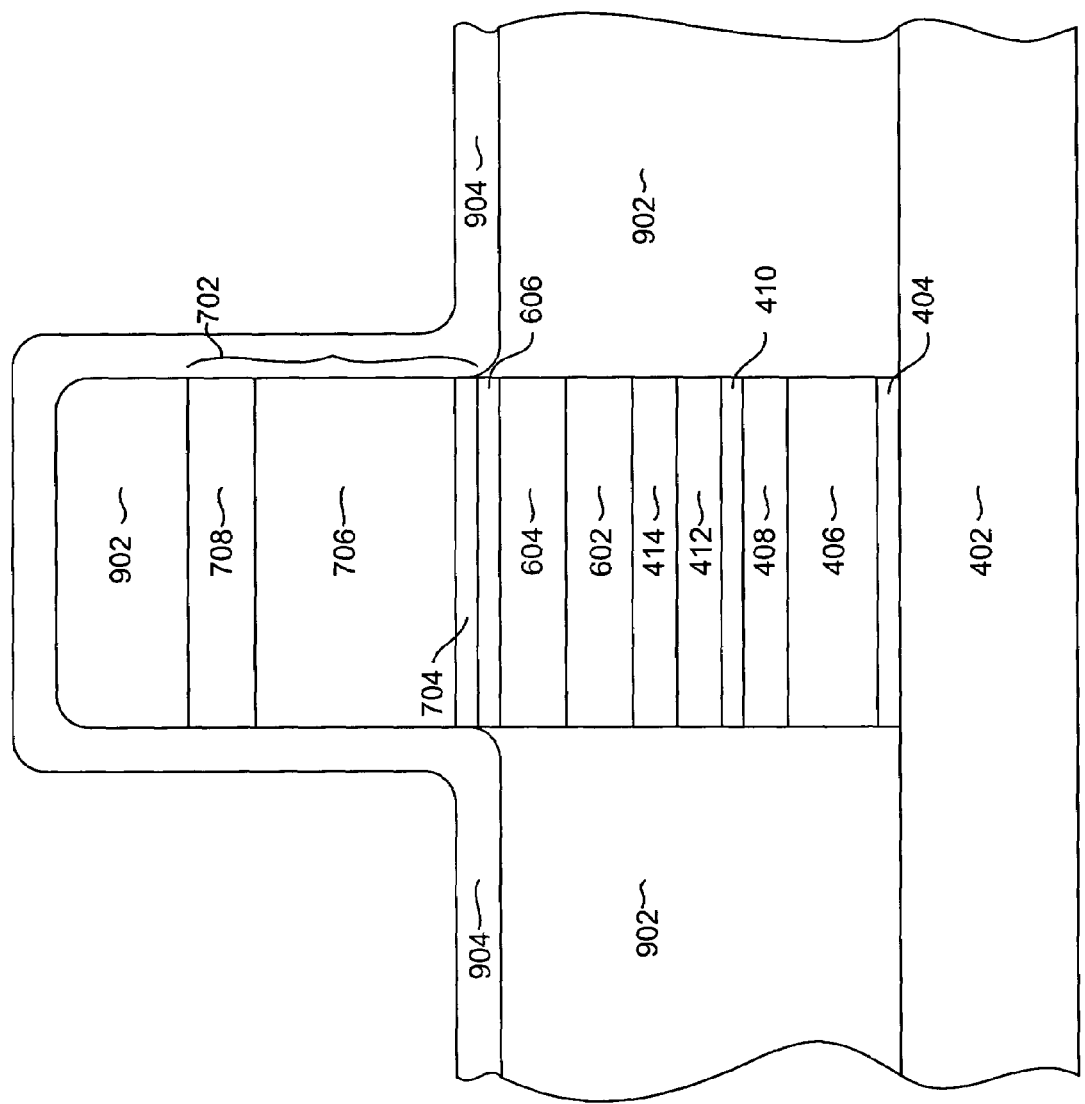
Figure 10:
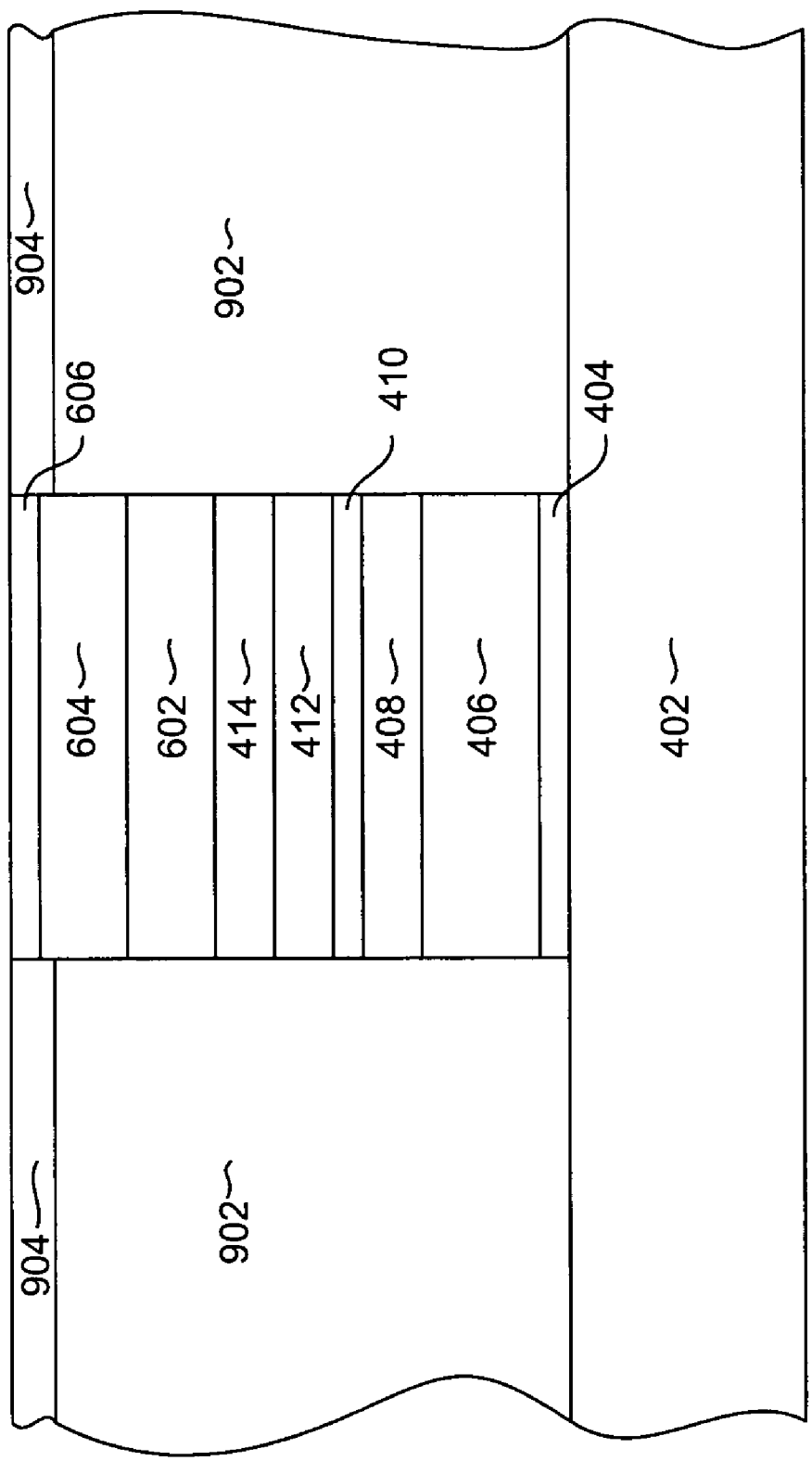
Figure 11:
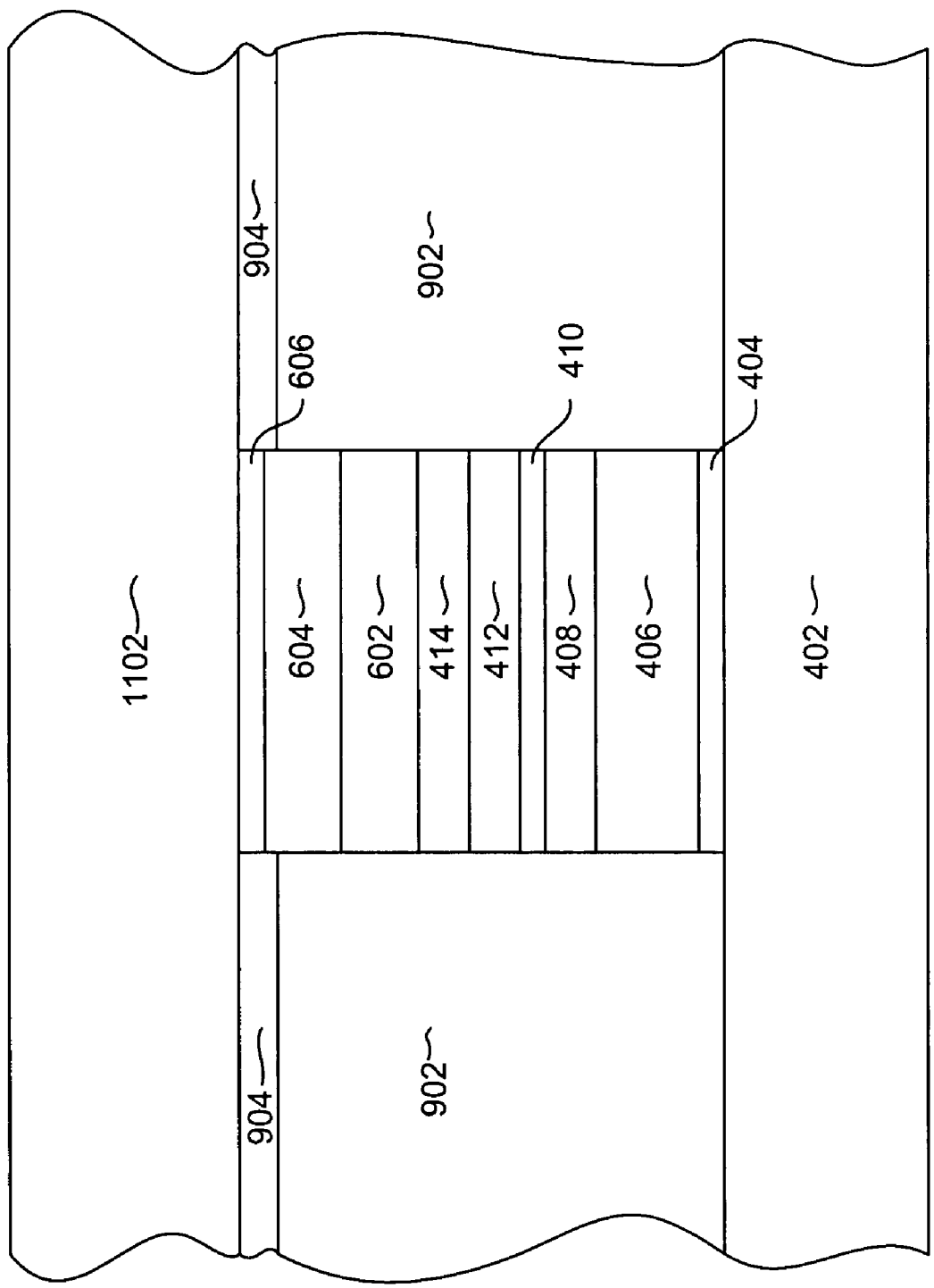

With reference now to FIG. 9, a layer of hard magnetic material 902 such as CoPt or CoPtCr is deposited followed by a layer of electrically conductive lead material such as Au, Cu or Rh 904. Then, with reference to FIG. 10, a chemical mechanical polishing process (CMP) can be performed to remove the mask structure 702. A reactive ion etch (RIE) may also be performed to remove the hard mask layer 704. Then, with reference to FIG. 11, a layer of non-magnetic gap material 1102 such as alumina is deposited.

In order to set the magnetizations 336, 334 as described with reference to FIG. 3, the sensor must undergo an annealing process. The sensor is annealed by heating the sensor (or actually a wafer containing many sensors) to a temperature near the blocking temperature of the AFM layer 406. For example if the AFM is constructed of PtMn, then the sensor would be raised to a temperature of 260-275 degrees F. A magnetic field is applied to orient the magnetization of the first magnetic layer 408 in a desired direction perpendicular to the ABS. This magnetic field is maintained while the sensor is cooled to room temperature.

Figure 4:
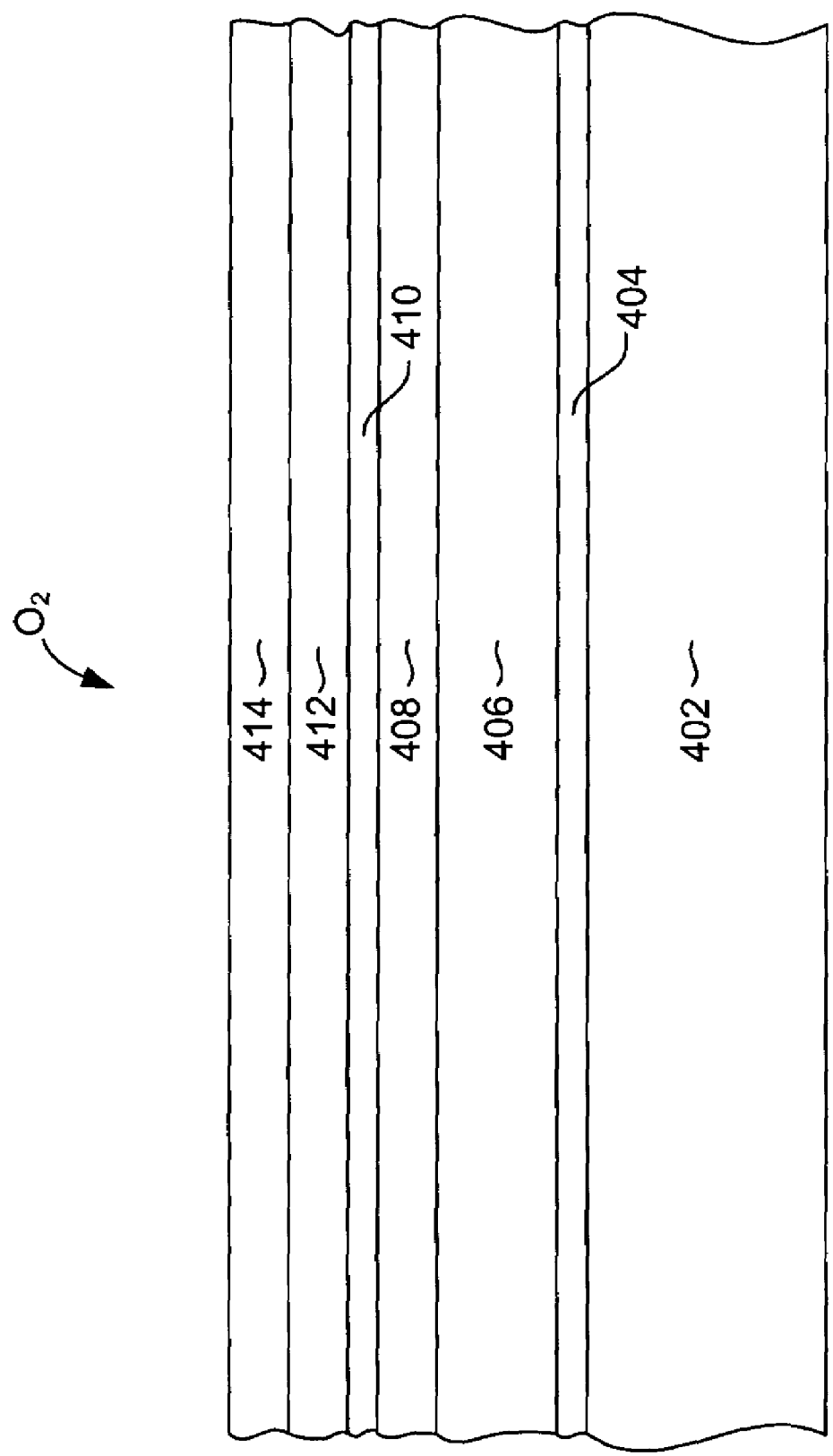
FIG. 4 is an ABS view of a magnetoresistive sensor shown in an intermediate stage of manufacture illustrating a method of manufacturing a sensor according to an embodiment of the invention.

Although oxygen was introduced into the spacer layer 414 as described in FIG. 4, it has been found that the process of annealing the sensor causes the oxygen to migrate completely out of the spacer layer. As a result, the Cu layer in the finished head maintains a desired Cu purity and high conductivity (ie. the spacer layer is not an oxide). What's more, materials testing after the annealing has found that virtually no oxygen remains in the magnetic layers 602, 604 of the free layer either. Therefore, the free layer maintains its desired magnetic properties. Trace amounts of oxygen have been detected in the Ta capping layer 606, but this does not adversely affect senor performance.

Although no oxygen remains in either the spacer layer 414, or magnetic layers of the free layer 602, 604, the presence of the oxygen during manufacture results in a reduction in magnetostriction of the magnetic layers 602, 604 (ie. the layers 602, 604 have a stronger negative magnetostriction). Therefore, the magnetostriction of the free layer 602, 604 (or 316 in FIG. 3) can be controlled by the addition of oxygen ($O_2$) as described above, without adversely affecting any of the magnetic or other properties of the sensor layers.

Figure 12:
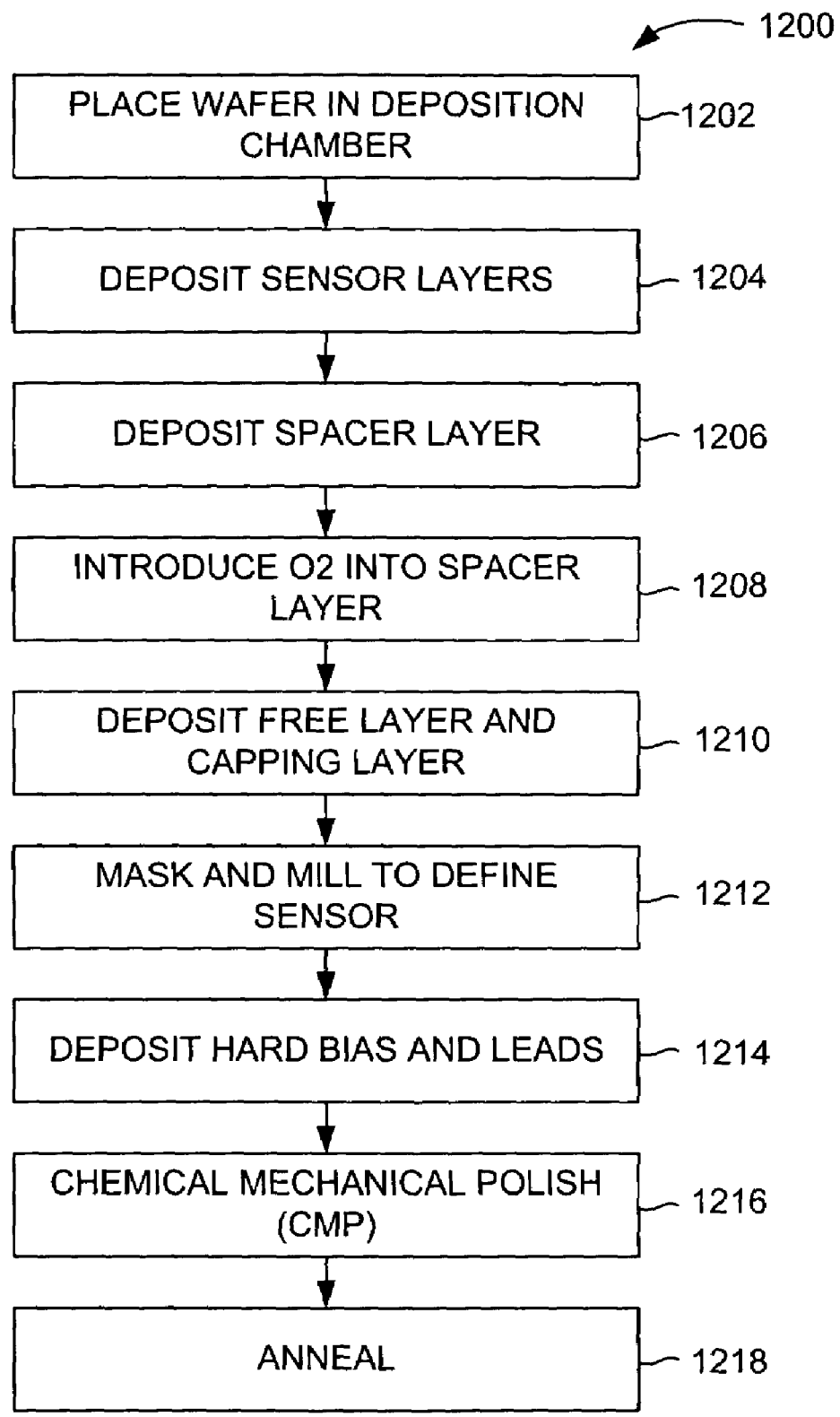
FIG. 12 is a flow chart summarizing a method of manufacturing a sensor according to an embodiment of the invention.

With reference to FIG. 12, a method 1200 for constructing a sensor according to an embodiment of the invention can be summarized. In a step 1202 a wafer is placed into a sputter deposition chamber. In a step 1204 one or more sensor layers are deposited. Then, in a step 1206, a spacer layer (preferably Cu) is deposited. In a step 1208 Oxygen is introduced into the spacer layer. This may be done while the spacer layer is being deposited or after the spacer layer has been deposited. Then, in a step 1210 a free layer and capping layer are deposited. Deposition of the free layer may include first depositing a layer of CoFe and then depositing a layer of NiFe. The capping layer may be Ta.

In a step 1212 one or more masking and milling procedures are performed to define the senor. Then, in a step 1214, hard bias and lead layers are deposited. In a step 1216, a CMP can be performed to remove the mask, and non-magnetic gap layer can be deposited. Finally, in a step 1218 the sensor is annealed to set the magnetization of the sensor and also remove the implanted oxygen from the spacer layer and free layer.

While various embodiments have been described above, it should be understood that they have been presented by way of example only, and not limitation. For example, although the sensor has been described as a current in plane sensor (CIP GMR), it could also be embodied in a current perpendicular to plane sensor such as a CPP GMR sensor. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for controlling magnetostriction of a magnetic free layer in a magnetoresistive sensor, the method comprising:
   depositing a non-magnetic spacer layer;
   introducing oxygen into the spacer layer;
   depositing a layer of magnetic material over the non-magnetic spacer layer; and
   heating the non-magnetic spacer layer and the magnetic material to a temperature of 260-275 degrees F. to cause substantially all oxygen to migrate out of the spacer layer.

2. A method as in claim 1, wherein the depositing a spacer layer comprises depositing Cu.

3. A method as in claim 1 wherein the depositing a magnetic material comprises, depositing a layer of CoFe.

4. A method as in claim 1 wherein the depositing a magnetic material comprises depositing a layer of CoFe and then depositing a layer of NiFe.

5. A method as in claim 1 further comprising after depositing a magnetic material, depositing a capping layer.

6. A method as in claim 1 further comprising after depositing a magnetic material, depositing a layer of Ta.

7. A method for controlling magnetostriction of a magnetic free layer in a magnetoresistive sensor, the method comprising:
   depositing a non-magnetic spacer layer;
   introducing oxygen into the spacer layer;
   depositing a layer of magnetic material over the non-magnetic spacer layer; and
   performing an, annealing process at a temperature of 260-275 degrees F. to cause substantially all of the oxygen to migrate out of the spacer layer.

8. A method for manufacturing a magnetoresistive sensor, comprising:
   providing a substrate;
   depositing a layer of antiferromagnetic material over the substrate;
   depositing a magnetic pinned layer structure;
   depositing a non-magnetic spacer layer;
   introducing oxygen into the non-magnetic spacer layer;
   depositing a magnetic free layer; and
   annealing the deposited layers to set a magnetization of the pinned layer, the annealing being performed at a temperature of 260-275 degrees F. sufficiently to cause substantially all of the oxygen to migrate out of the spacer layer.

9. A method as in claim 8 further comprising, after depositing the magnetic free layer, depositing a Ta layer.

10. A method as in claim 8 wherein the depositing a magnetic free layer includes depositing a layer of CoFe and dien depositing a layer of NiFe.

11. A method as in claim 8 wherein the introducing oxygen into the free layer comprises depositing the spacer layer and then exposing the spacer layer to oxygen.

12. A method as in claim 8 wherein the introducing oxygen into the free layer comprises introducing oxygen into the spacer layer during deposition of the spacer layer.

13. A method as in claim 8 wherein the spacer layer comprises Cu.

14. A method for constructing a magnetoresistive sensor, comprising:
   providing a deposition chamber, the deposition chamber containing a chuck;
   placing a wafer onto the chuck within the chamber;
   depositing a layer of antiferromagnetic material (AFM layer), the AFM layer having a blocking temperature;
   depositing a magnetic pinned layer onto the AFM layer;
   depositing a spacer layer;
   introducing oxygen into the spacer layer;
   depositing a magnetic free layer;
   depositing a capping layer;

forming a mask over the deposited layers;

performing an ion mill to remove portions of the sensor material not covered by the mask; and performing an anneal at a temperature fo 260 to 275 degrees F. to set a magnetization of the magnetic pinned layer structure, the anneal being performed sufficiently to cause substantially all of the oxygen to migrate out of the spacer layer.

15. A method as in claim 14 wherein the performing an anneal includes heating the deposited layers to a temperature near the blocking temperature of the AFM layer.

16. A method as in claim 14 wherein the AFM layer comprises PtMn.

17. A method as in claim 14 wherein the AFM layer comprises IrMn.

18. A method as in claim 14 wherein the depositing a magnetic pinned layer structure includes depositing a first magnetic layer (AP1), depositing a Ru coupling layer and then depositing a second magnetic layer (AP2).

19. A method as in claim 14 wherein the spacer layer comprises Cu.

20. A method as in claim 14 wherein the introducing oxygen into the spacer layer comprises introducing an atmosphere containing oxygen into the chamber during deposition of the spacer layer.

21. A method as in claim 14 wherein the introducing oxygen into the spacer layer comprises depositing the spacer layer using a target that contains oxygen.

22. A method as in claim 14 wherein the introducing oxygen into the spacer layer comprises depositing the spacer layer using a target that contains copper and oxygen.

23. A method as in claim 14 wherein the introducing oxygen into the spacer layer comprises depositing the spacer layer using a target that contains copper oxide.

24. A method as in claim 14 wherein the introducing oxygen into the spacer layer comprises depositing the spacer layer, and then introducing oxygen into the chamber to expose the spacer layer to oxygen.

25. A method as in claim 14 wherein the depositing a magnetic free layer includes depositing a layer of CoFe and then depositing a layer of NiFe.

26. A method as in claim 1 wherein the heating is performed sufficiently to cause substantially all of the oxygen to migrate out of the magnetic material.

27. A method as in claim 7 wherein the annealing process causes substantially all of the oxygen to migrate Out of the magnetic material.

28. A method as in claim 8 wherein the annealing process is performed sufficiently to cause substantially all of the oxygen to migrate out of the magnetic free layer.

29. A method as in claim 14 wherein the anneal process is performed sufficiently to cause substantially all of the oxygen to migrate out of the magnetic free layer.

* * * * *

UNITED STATES PATENT AND TRADEMARK OFFICE
CERTIFICATE OF CORRECTION

PATENT NO. : 7,524,381 B2
APPLICATION NO. : 11/318274
DATED : April 28, 2009
INVENTOR(S) : Thai et al.

It is certified that error appears in the above-identified patent and that said Letters Patent is hereby corrected as shown below:

In claim 10, column 8, line 46, please replace "dien" with --then--.

In claim 27, column 10, line 18, please replace "migrate Out" with --migrate out--.

Signed and Sealed this

Eighth Day of June, 2010

David J. Kappos
*Director of the United States Patent and Trademark Office*